United States Patent [19]
Mayer et al.

[11] Patent Number: 6,023,415
[45] Date of Patent: Feb. 8, 2000

[54] APPARATUS FOR ELECTRO-MAGNETIC INTERFERENCE (EMI) AND RADIO FREQUENCY INTERFERENCE (RFI) CONTAINMENT WITH IN A CHASSIS

[75] Inventors: David Mayer; Ronald P. Dean; John P. Hoppal; Rex Seader, all of Fort Collins, Colo.

[73] Assignee: Hewlett-Packard Company, Palo Alto, Calif.

[21] Appl. No.: 08/940,414

[22] Filed: Sep. 30, 1997

[51] Int. Cl.⁷ .............................. H05K 9/00; H05K 5/00
[52] U.S. Cl. ..................... 361/816; 361/727; 361/753; 361/756; 361/796; 361/802; 361/818; 174/35 R
[58] Field of Search .................... 361/727, 752, 361/753, 756, 759, 796, 800, 802, 816, 818; 174/35 R, 35 GC, 50; 206/706, 719; 211/41.17; 312/223.2

[56] References Cited

U.S. PATENT DOCUMENTS

| | | | |
|---|---|---|---|
| 5,715,146 | 2/1998 | Hoppal | 361/796 |
| 5,770,822 | 6/1998 | Abolitz et al. | 174/35 GC |
| 5,865,518 | 2/1999 | Jarrett et al. | 312/223.2 |

*Primary Examiner*—Leo P. Picard
*Assistant Examiner*—Jayprakash N. Gandhi
*Attorney, Agent, or Firm*—Cynthia S. Mitchell

[57] ABSTRACT

A printed circuit board and bulkhead assembly with I/O connectors that may be slidingly mated with a rear panel bulkhead frame of a computer chassis without removing the rear panel and without having to remove any mounting hardware. The I/O connectors are attached to the bulkhead assembly in such a manner that the I/O connectors clear the rear panel bulkhead frame when the bulkhead assembly is being slidingly mated with the rear panel bulkhead frame. The I/O connectors extend through the rear panel bulkhead frame once the bulkhead assembly is mated with the rear panel bulkhead frame. When fully installed, the bulkhead assembly and the rear panel bulkhead frame create a barrier against EMI/RFI radiation emissions escaping the computer chassis.

5 Claims, 8 Drawing Sheets

APPARATUS FOR ELECTRO-MAGNETIC INTERFERENCE (EMI) AND RADIO FREQUENCY INTERFERENCE (RFI) CONTAINMENT WITH IN A CHASSIS

FIELD OF THE INVENTION

The present invention relates generally to the field of computer and workstation electronic assemblies and more particularly to installation and removal of a printed circuit board within a computer chassis. Still more particularly, the present invention deals with a bulkhead attached to a printed circuit board that is able to slide onto a bulkhead opening in the back panel of a computer chassis with the resulting bulkhead assembly substantially containing electromagnetic interference and radio frequency interference within the computer chassis.

BACKGROUND OF THE INVENTION

In the computer and workstation industry it would be desirable to have a single printed circuit board that is able to be connected to the back plane and extend through the back panel of the computer chassis with I/O connectors. It would also be desirable to have such a printed circuit board that is relatively easy to install and remove from the computer chassis without excessive hardware installation and removal and with minimal assembly and disassembly of the computer chassis without removing the rear panel of the computer chassis.

It is further desirable in the computer and workstation industry to be able to contain the electro-magnetic interference (EMI) and the radio frequency interference (RFI) within a computer or workstation housing. This is of particular concern with respect to the rear bulkhead area of the chassis having the input and output (I/O) devices, such as power supply connector, printer connector, monitor connections, mouse connectors, keyboard connector, modem connector, scanner connector, etc.

SUMMARY OF THE INVENTION

The present invention improves computer assembly mechanical design by providing a convenient system for inserting or removing a printed circuit board assembly to the computer assembly without having to remove the rear panel of the computer chassis. The present invention also improves the ability and consistency of containing EMI/RFI radiation within the computer chassis, especially around the rear panel and bulkhead assembly.

The present invention comprises a computer chassis with a backplane that is perpendicular to a rear panel of the computer chassis. A printed circuit board is mated with the back plane and the I/O connectors on the bulk head connected to the printed circuit board is slid into a mated position on the rear bulkhead panel. The bulkhead is U-shaped and fits snugly over the rear bulkhead panel and makes EMI/RFI contact with the rear bulkhead panel, while allowing the rear I/O connectors to extend through the rear bulkhead panel once the bulkhead is mated with the rear bulkhead panel.

BRIEF DESCRIPTION OF THE DRAWINGS

The above and other objects, features and advantages of the present invention will be better understood by reading the following more particular description of the invention, presented in conjunction with the following drawings, wherein.

DETAILED DESCRIPTION OF THE PREFERRED EMBODIMENT

Figure 1:
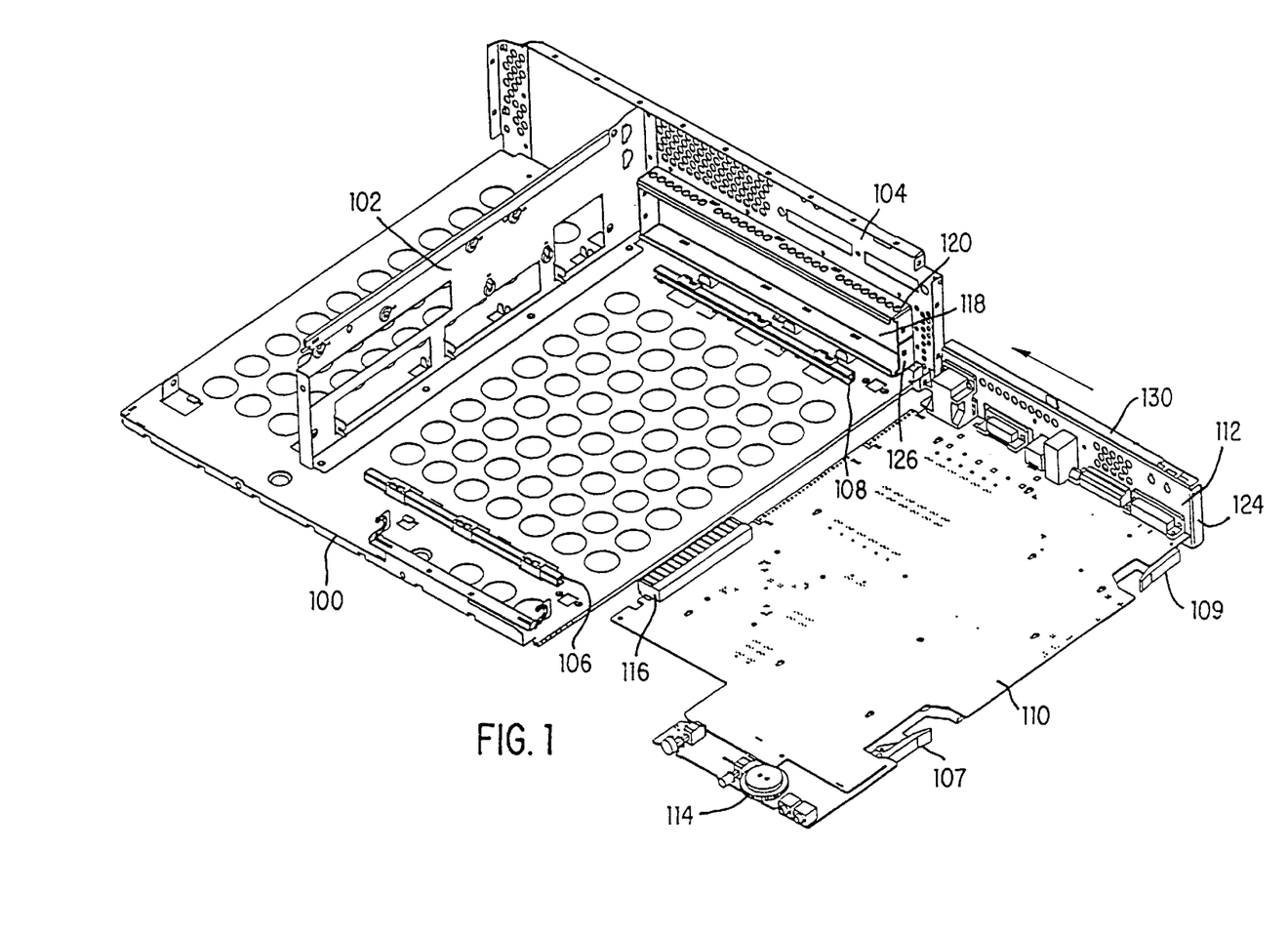
FIG. 1 shows a front, top isometric view of a printed circuit board with a bulkhead being mated with a rear panel bulkhead assembly of a computer chassis according to the present invention.
Figure 2:
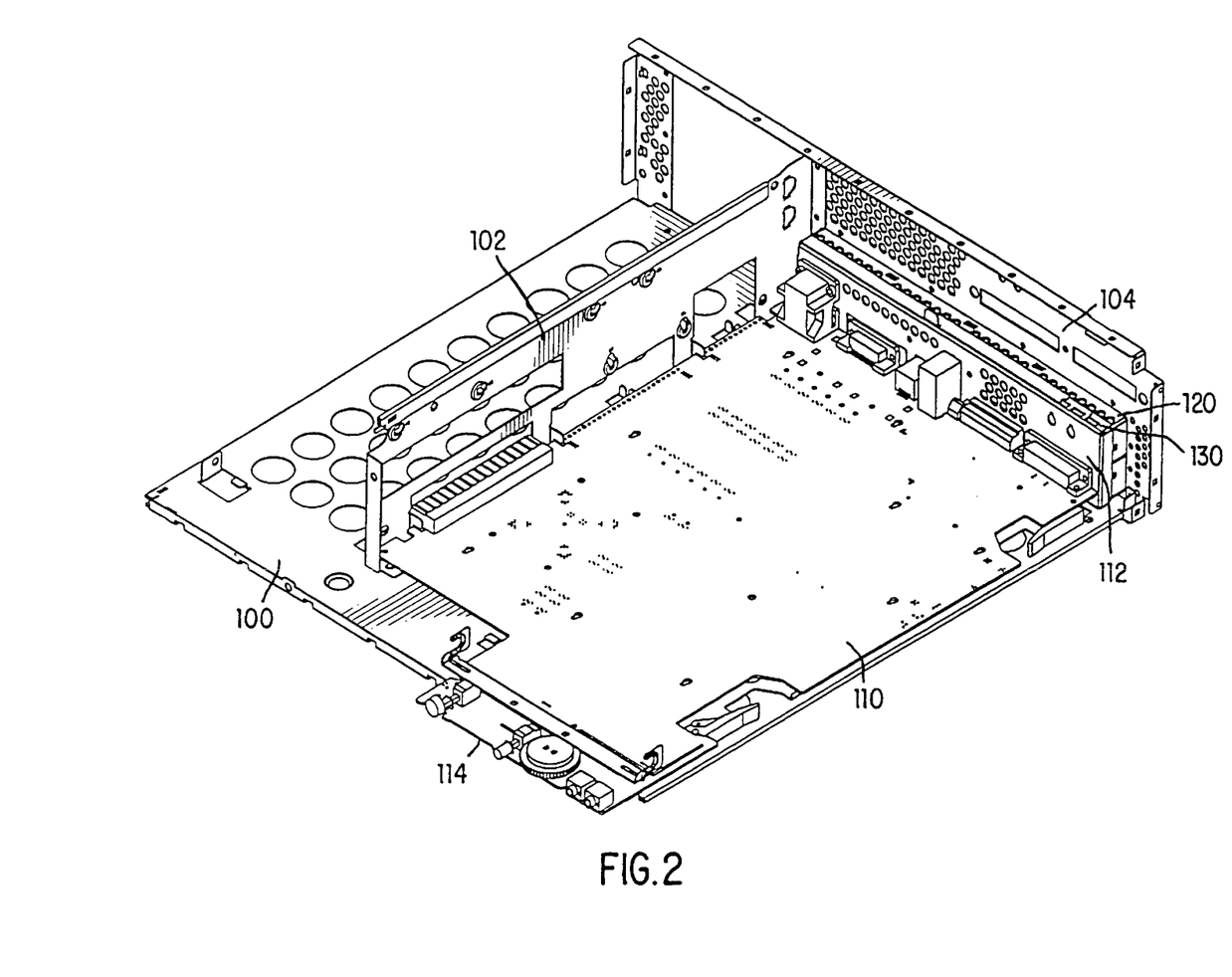
FIG. 2 shows a front, top isometric view of a printed circuit board with a bulkhead mated with a rear panel bulkhead assembly of a computer chassis according to the present invention.

FIGS. 1 and 2 show a front, top isometric view of a printed circuit board 110 and bulkhead assembly 112 being mated with a rear panel 104 of a computer chassis 100. The bulkhead assembly 112 mates with the rear panel 104 by means of rails 130 of the bulkhead assembly slidingly mating with rear panel bulkhead frame 120, which surrounds rear panel bulkhead opening in 118. The rails 130 of the printed circuit board 110 are aligned with the rear panel bulkhead frame 120 and the printed circuit board is guided on card guides 106 and 108 until the printed circuit board 110 is in the fully installed position, side wall 126 of rear panel bulkhead frame 120 will be in contact with side wall 124 of bulkhead assembly rail 130 and connectors 116 are mated with a backplane (not shown) through holes in internal chassis wall 102, as shown in FIG. 2.

Figures 3A, 3B:
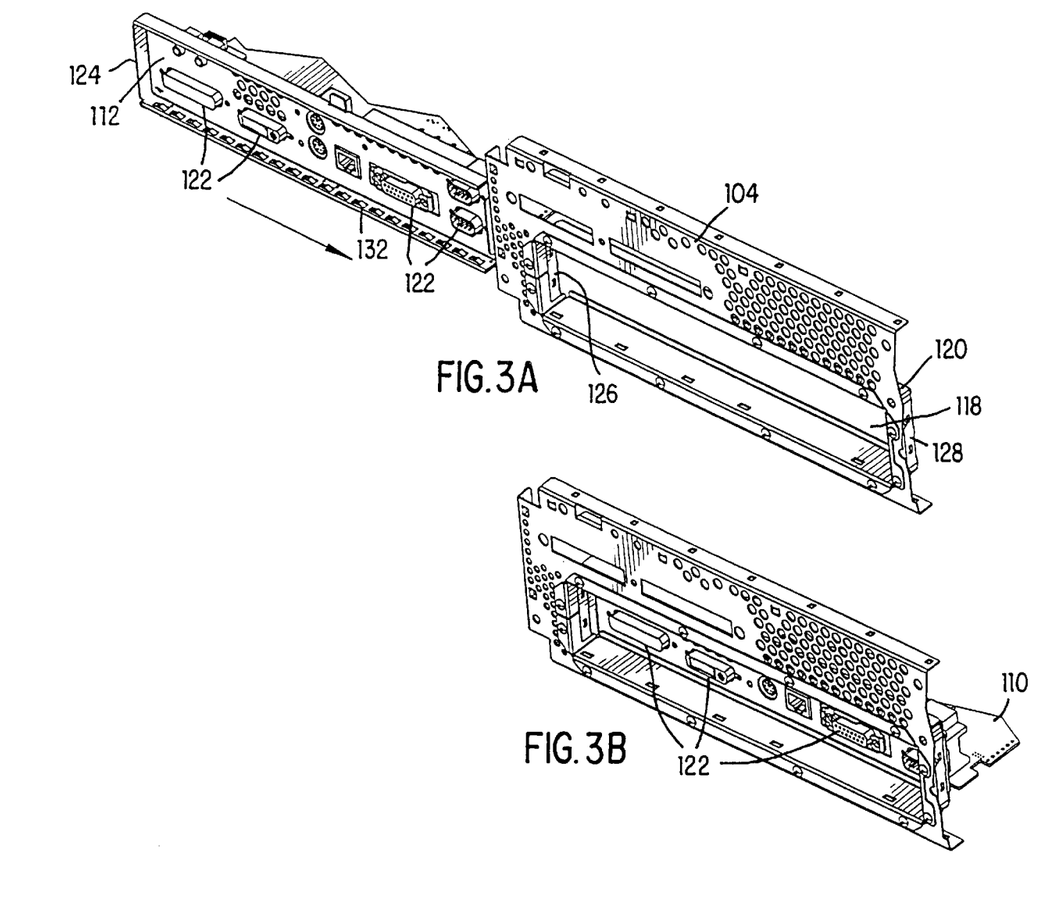
FIG. 3A ows a rear, top isometric view of bulkhead being mated with a rear panel bulkhead assembly of a computer chassis according to the present invention.
FIG. 3B shows a rear, top isometric view of bulkhead mated with a rear panel bulkhead assembly of a computer chassis according to the present invention.

FIGS. 3A and 3B show a rear, top isometric view of the printed circuit board 110 and bulkhead assembly 112 being mated with rear panel 104. I/O connectors 122 extend through to the back side of bulkhead assembly 112. Side wall 126 of rear panel bulkhead frame 120 is shorter than sidewall 128 and the rest of the rear panel bulkhead frame 120 by just enough so that as the bulkhead assembly 112 is sliding onto the rear panel bulkhead frame 120, the I/O connectors 122 extending through the back side of the bulkhead 112 do not come into contact with side wall 126. Once the bulkhead assembly 112 is fully mated with the rear panel bulkhead frame 120, the I/O connectors 122 are accessible through hole 118 in the rear panel bulkhead frame 120, as shown in FIG. 3B.

Figure 4:
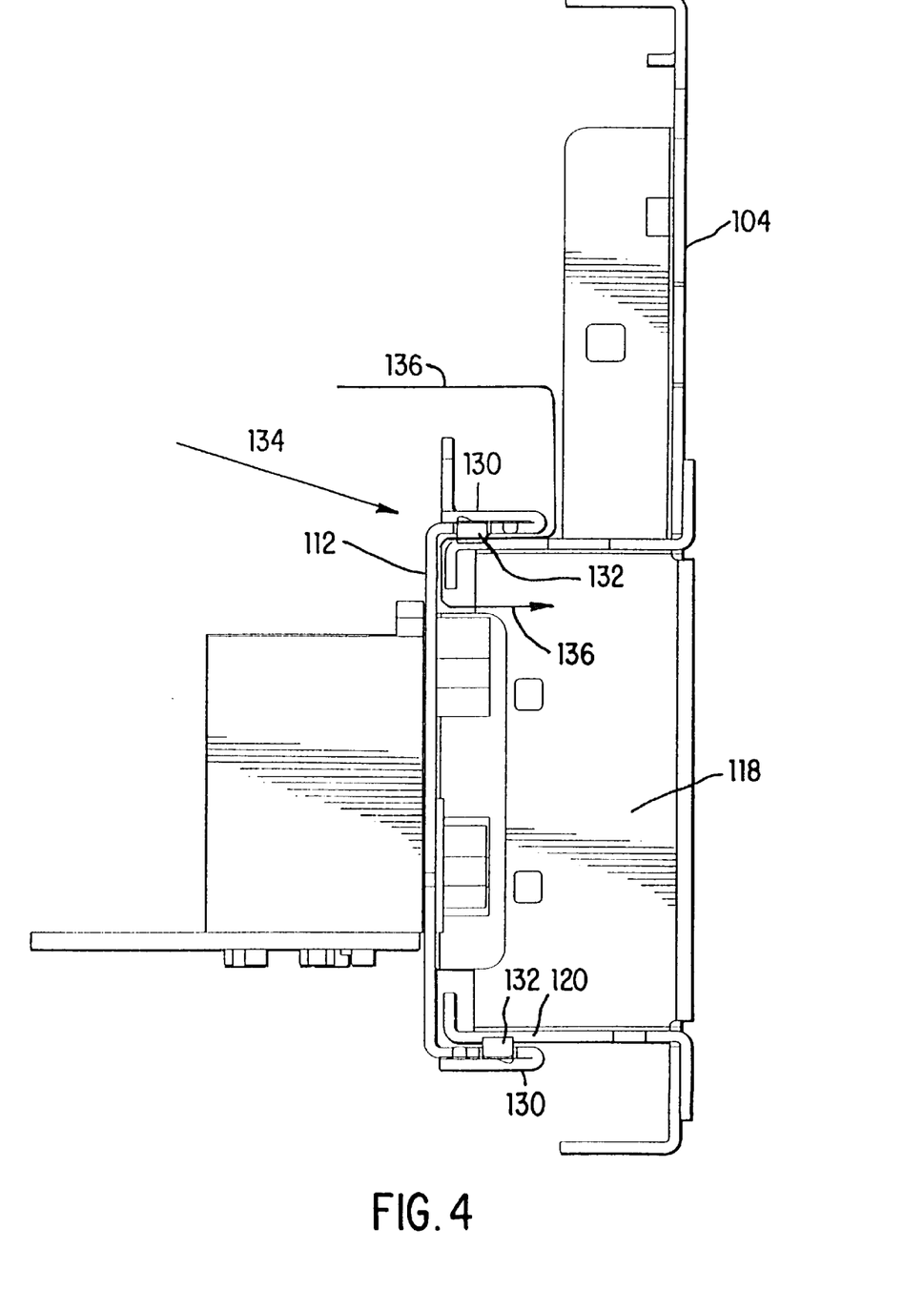
FIG. 4 shows a cutaway side view of a bulkhead mated with a rear panel bulkhead assembly of a computer chassis according to the present invention.

FIG. 4 shows a side cut-away view of the bulkhead assembly 112 mated with the rear panel bulkhead frame 120. The U-shaped design of bulkhead assembly and the manner in which bulkhead rails 130 wrap around the rear panel bulkhead frame 120 with the EMI/RFI gaskets 132 creating a seal therebetween makes it extremely difficult for EMI/RFI radiation to escape the computer chassis 100 through the bulkhead area. Arrow 134 shows a relatively straight path of the EMURFI being thwarted from exiting the chassis by the bulkhead assembly 112 mated with the rear panel bulkhead frame 120. Arrow 136 illustrate the potential path that EMI/RFI radiation would have to take in order to escape the chassis via the bulkhead region of the present invention. In order to escape the chassis via the bulkhead region of the present invention, the EMI/RFI radiation would not only have to take a curved path as illustrated by arrow 136, but would also have to travel between two of the EMI/RFI gasket fingers 132.

Figure 5A:
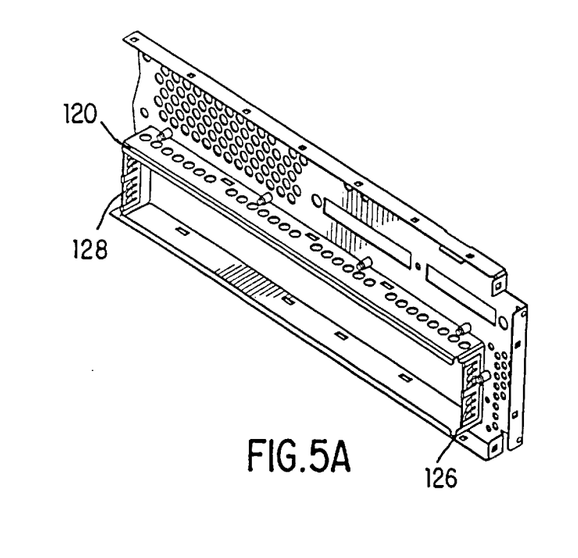
FIG. 5A shows a front, top isometric view of a rear panel bulkhead assembly according to the present invention.
Figure 5B:
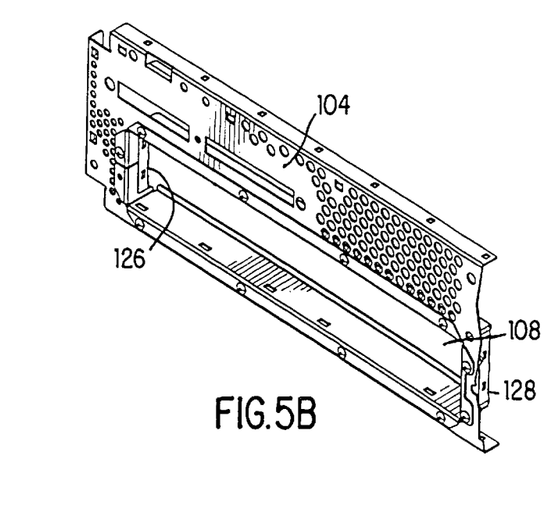
FIG. 5B shows a rear, top isometric view of a rear panel bulkhead assembly according to the present invention.
Figure 5C:
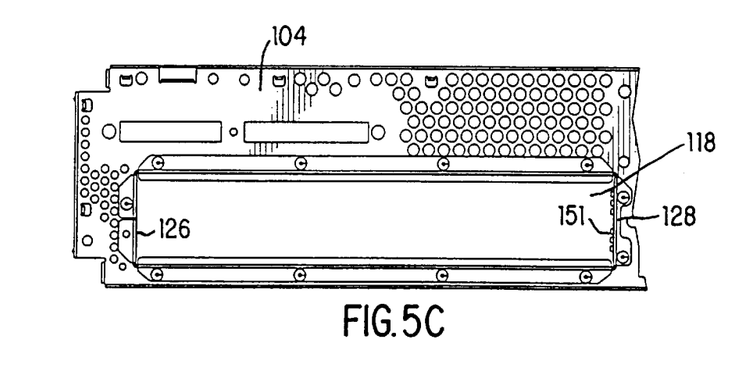
FIG. 5C shows a rear view of a rear panel bulkhead assembly according to the present invention.
Figure 6A:
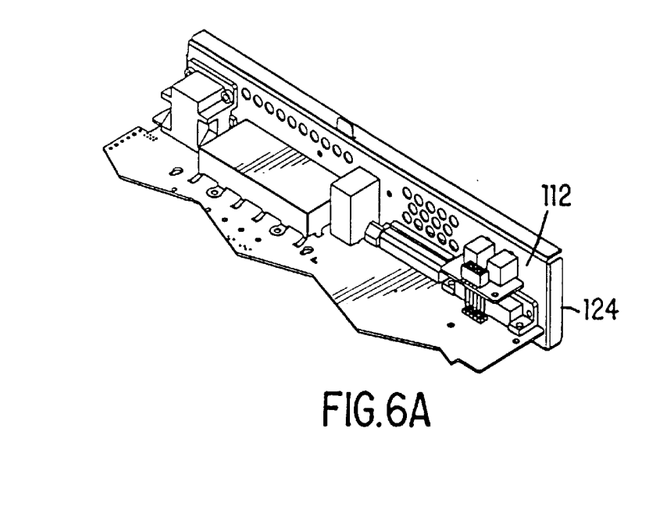
FIG. 6A shows a front, top isometric view of a printed circuit board and bulkhead assembly according to the present invention.
Figure 6B:
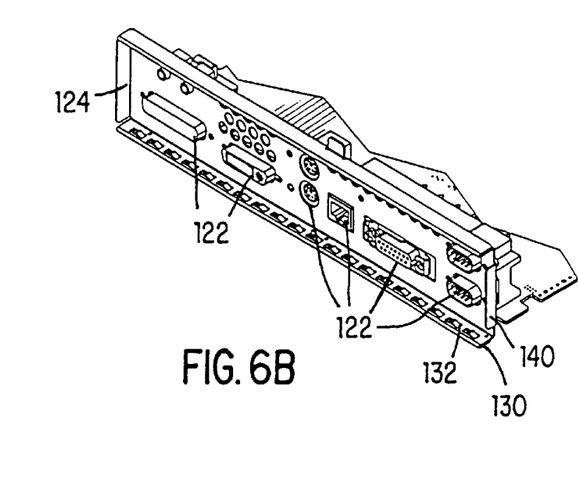
FIG. 6B shows a rear, top isometric view of a printed circuit board and bulkhead assembly according to the present invention.
Figure 6C:
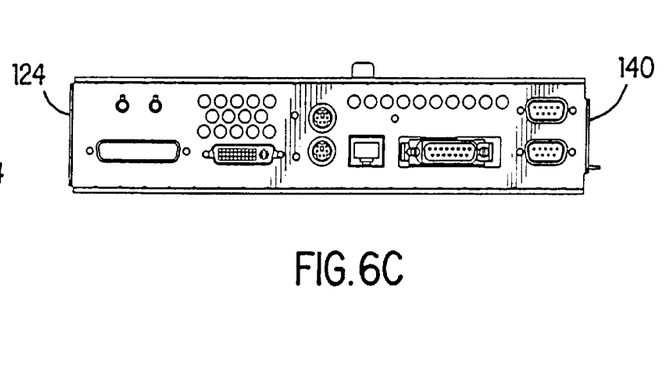
FIG. 6C shows a rear view of a bulkhead assembly according to the present invention.
Figure 6D:
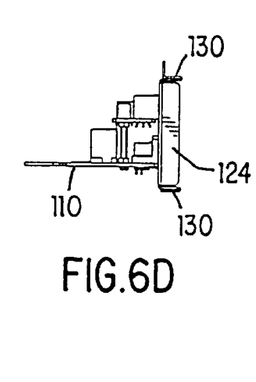
FIG. 6D shows a first side view of a printed circuit board and bulkhead assembly according to the present invention.
Figure 6E:
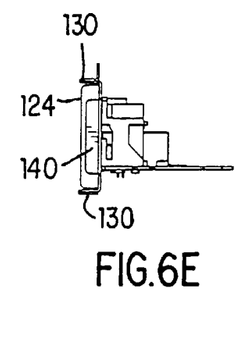
FIG. 6E shows a second side view of a printed circuit board and bulkhead assembly according to the present invention.

FIGS. 5A–C shows several views of the rear panel 104 and the rear panel bulkhead frame 120. As can be seen in FIGS. 5A and B, first end EMI/FRI gasket 126 is narrower than the second end EMI/RFI gasket 128, so that I/O connectors 122 on the bulkhead assembly 112 will just miss the end EMI/RFI gasket 126 as the bulkhead assembly 112 is slid on or off of the rear panel bulkhead frame 120. When the bulkhead assembly 112 is mated with the rear panel bulkhead frame 120, first end rail 140 (shown in FIGS. 6B and 6E) of bulkhead assembly 112 is in contact with second end EMI/RFI gasket 128, second end rail 124 of bulkhead assembly 112 is in contact with first end EMI/RFI gasket 126 and EMI/RFI gasket 132 along the top and bottom rails of the bulkhead assembly 112 is in contact with the top and bottom of rear panel bulkhead frame 120, creating an EMI/RFI emission seal between the bulkhead assembly rails and the rear panel bulkhead frame 120.

The rear panel bulkhead 104 may be made of any electrically conductive, hard material, such as steel or aluminum and may be made by any manufacturing method, such as machining, cutting, pressing, punching, etc. The rear panel bulkhead frame 120 may be made of any electrically conductive hard material, such as steel or aluminum and may be made by any manufacturing method, such as machining, cutting, pressing, punching, etc. The rear panel bulkhead 104 and the rear panel bulkhead frame 120 may be made at the same time or may be made separately and then attached by means of screws, rivets, bolts, glue, solder, or any other known attaching means.

Figures 7A, 8A, 8B:
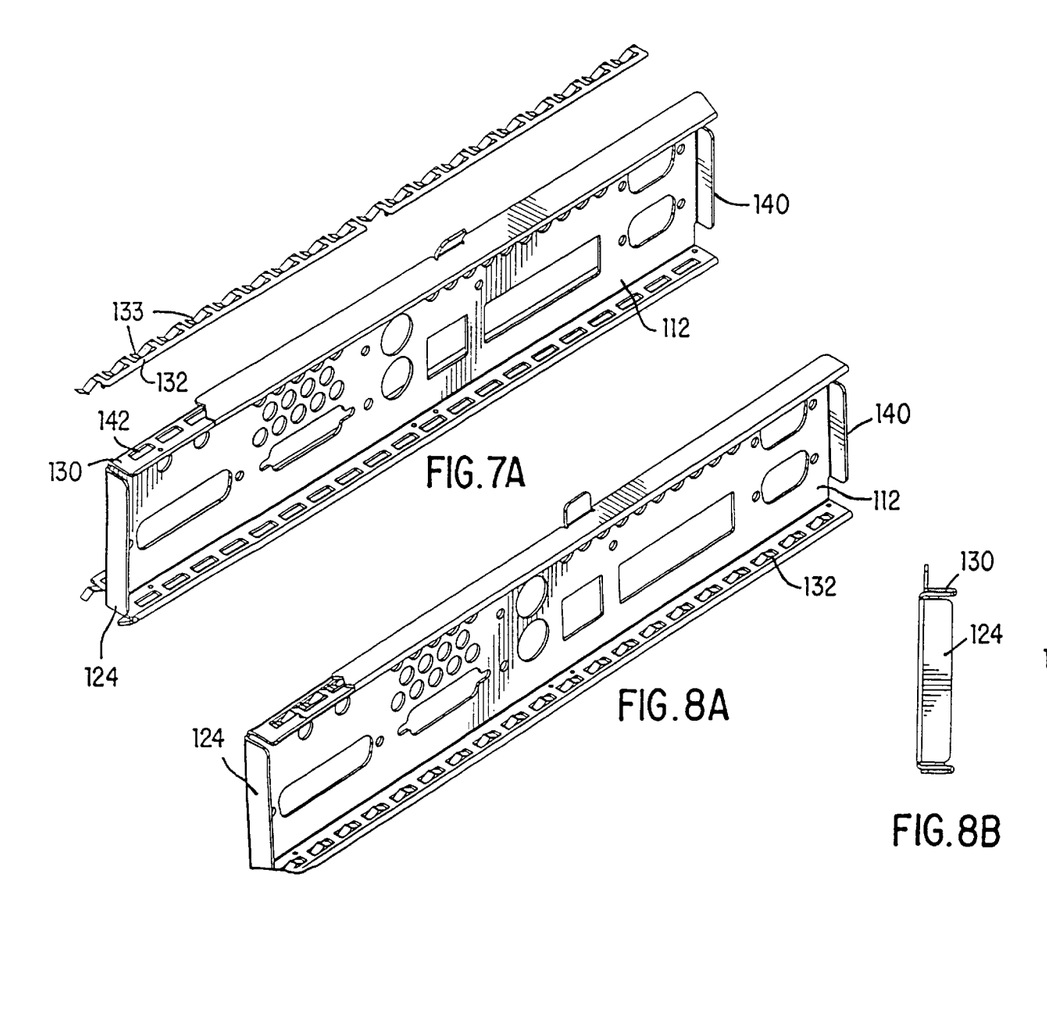
FIG. 7A shows a rear, top isometric view of a bulkhead and EMI/RFI gasket being assembled according to the present invention.
FIG. 8A shows a rear, top isometric view of a bulkhead and EMI/RFI assembly according to the present invention.
FIG. 8B shows a first side view of a bulkhead and EMI/RFI gasket assembly according to the present invention.
Figure 7B:
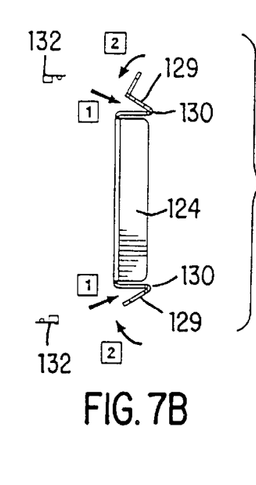
FIG. 7B shows a first side view of a bulkhead and EMI/RFI gasket being assembled according to the present invention.
Figure 8C:
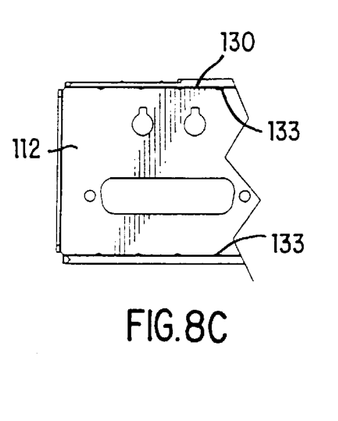
FIG. 8C shows a rear view of a bulkhead and EMI/RFI gasket assembly according to the present invention.

FIGS. 7A–E show various views of the bulkhead assembly 112 and the printed circuit board 110. As can be seen in FIGS. 7B and E, first end rail 140 is narrower than second end rail 124, such that when the bulkhead assembly 112 is being slid on and off of the rear panel bulkhead frame 120, first end rail 140 will clear first end EMI/RFI gasket 126, but will still mate with second end EMI/RFI gasket 128, thus sealing the bulkhead region against EMI/RFI radiation emissions.

FIGS. 7A–7B and 8A–8C show various views of bulkhead assembly 112 without I/O connectors 122 and printed circuit board 110. FIGS. 7A–B show how EMI/RFI gasket 132 is attached to top and bottom rails 130 with individual bent leaves 133 of gasket 132 extending through holes 142 of the inside edge of rails 130. Then a hem 129 of rails 130 is wrapped around EMI/RFI gaskets 132, locking EMI/RFI gaskets inside the rails 130. The individual leaves 133 of EMI/RFI gasket 132 that extend through the holes 142 in rails 130 contact rear panel bulkhead frame 120 when the bulkhead assembly 112 is mated with the rear panel bulkhead frame 120, thus creating an EMI/RFI radiation emission shield.

Bulkhead assembly 112 is made of any electrically conductive, hard material, such as steel or aluminum and may be made by any manufacturing method, such as machining, cutting, pressing, punching, etc. Bulkhead assembly 112 may be attached to printed circuit board 110 by means of screws, rivets, bolts, glue, solder, or any other known attaching means. Top and bottom rails 130, first end rail 140 and second end rail 124 may be integral with the main body of bulkhead assembly 112. EMI/RFI gasket 132 may be made of any electrically conductive material with good spring properties, such as stainless steel or beryllium copper and may be made by means of any manufacturing method, such as machining, cutting, pressing, punching, etc.

Figure 9A:
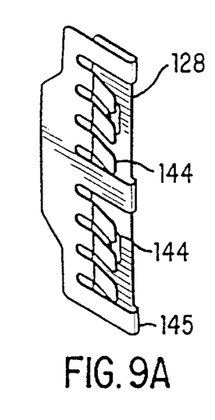
FIG. 9A shows a front isometric view of a side EMI/RFI gasket according to the present invention.
Figure 9B:
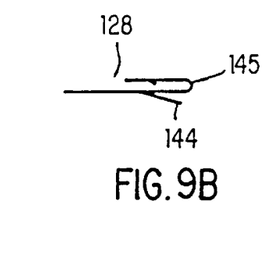
FIG. 9B shows an end view of a side EMI/RFI gasket according to the present invention.
Figure 9C:
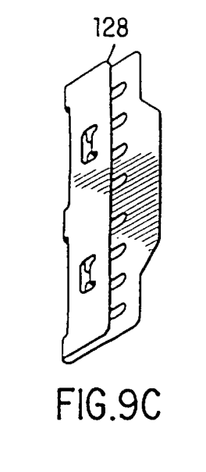
FIG. 9C shows a rear isometric view of a side EMI/RFI gasket according to the present invention.
Figure 9D:
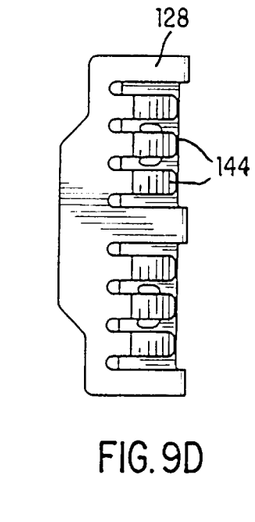
FIG. 9D shows a front view of a side EMI/RFI gasket according to the present invention.
Figure 9E:
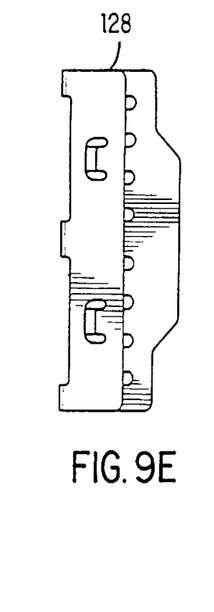
FIG. 9E shows a rear view of a side EMI/RFI gasket according to the present invention.

FIGS. 9A–E show various views of EMI/RFI end gasket 126, which may be made of stainless steel or beryllium copper and manufactured by means of any manufacturing method, such as machining, cutting, pressing, punching, etc. EMI/RFI end gasket 126 is a single integral unit and is bent along 145 as best illustrated in FIG. 9B. Fingers 144 are bent as shown in FIG. 9B. EMI/RFI end gasket 126 may be attached to rear panel 104 by means of rivets, snap features, welding, etc. EMI/RFI end gasket 128 is made similarly to EMI/RFI end gasket 126, except EMI/RFI end gasket 128 is slightly wider than EMI/RFI end gasket 126, as illustrated best in FIG. 6E.

Once the bulkhead assembly 112 is attached to the printed circuit board 110, and the I/O connectors are attached to the bulkhead assembly 112 and to the printed circuit board 110, the bulkhead assembly 112 may be mated with the computer chassis via the rear panel bulkhead frame 120. The printed circuit board is aligned with the card guides 106 and 108 and the bulkhead assembly is aligned with the rear panel bulkhead frame 120. Then the printed circuit board 110 and the bulkhead assembly 112 are slidingly mated to the computer chassis 100 and the rear panel bulkhead frame 120. Once the printed circuit board 110 and the bulkhead assembly 112 are mated with the computer chassis 100 and the rear panel bulkhead frame 120, the printed circuit board 110 may be locked into place by means of injector/ejector levers 107 and 109, which are common in the field.

If the printed circuit board 110 ever needs to be removed from the computer chassis for repair, upgrade or replacement, the chassis cover (not shown) may be slidingly removed from the chassis bottom 100. Then the injector/ejector levers 107 and 109 may unlock the printed circuit board 110 from its locked and mated position with the computer chassis 100. Next the printed circuit board 110 and bulkhead assembly 112 may be slidingly removed from the computer chassis 100 and the rear panel bulkhead frame 120. It should be noted that the printed circuit board 110 and bulkhead assembly 112 may be mated with and removed from the computer chassis 100 and rear panel bulkhead frame 120 without removing the rear panel and without the use of screws or other mounting hardware, other than the injector/ejector levers 107 and 109. This makes for a substantial savings in terms of mounting hardware and assembly and disassembly costs.

The present invention also allows the printed circuit board 110 to be mated with the back plane (not shown) at internal wall 102. This mating is perpendicular to the bulkhead 120, which allows the front of the printed circuit board to extend through the front panel (not shown) of the chassis with user interface devices 114. Typically, a printed circuit board is attached to the back plane parallel to the direction of the I/O connectors and the bulkhead, which requires the rear panel to be removed and does not permit a single printed circuit board to extend through both the front panel with user interface devices 114 and through the rear panel with the I/O connectors. The present invention solves these problems.

Reference terminology in this specification, such as rear, front, top, bottom, first, second, etc. have been used merely for ease of description and should not be limiting to the scope of the invention in any manner.

The foregoing description of the present invention has been presented for purposes of illustration and description. It is not intended to be exhaustive or to limit the invention to the precise form disclosed, and other modifications and variations may be possible in light of the above teachings. For example, the concept of slidingly mating the printed circuit board 110 and bulkhead assembly 112 having I/O connectors 122 with the rear panel bulkhead frame 120 may apply to any electronic device that requires a printed circuit board and a bulkhead with I/O connectors, such as a printer, electronic game, scanner, monitor, television, etc. Also, the bulkhead, rear panel, and rear panel bulkhead frame could be made of any stiff EMI/RFI safe material, rather than just steel or aluminum. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An electronic assembly comprising:

an electronic assembly chassis having a front panel, bottom side panel and a rear panel, said rear panel being attached to said bottom panel, said rear panel having a rear panel bulkhead frame;

a back plane mounted in said electronic assembly chassis;

a printed circuit board assembly;

a bulkhead attached to said printed circuit board assembly; and

I/O connectors mounted on said bulkhead, wherein said bulkhead and printed circuit board assembly slidingly mate with said rear panel bulkhead frame, said bulkhead wraps around said rear panel bulkhead frame when said bulkhead is mated with said rear panel bulkhead frame, said I/O connectors extending through said rear panel bulkhead frame when said bulkhead is mated with said rear panel bulkhead frame.

2. The electronic assembly according to claim 1, wherein said rear panel remains attached to said bottom panel when said bulkhead is being mated with and unmated from said rear panel bulkhead frame.

3. The electronic assembly according to claim 1 further comprising rails attached to said bulkhead, wherein said rails wrap around said rear panel bulkhead frame when said bulkhead is mated with said rear panel bulkhead frame.

4. The electronic assembly according to claim 3 further comprising EMI/RFI gaskets attached to said rails of said bulkhead, wherein said EMI/RFI gaskets are in contact with said rear panel bulkhead frame when said bulkhead is mated with said rear panel bulkhead frame.

5. The electronic assembly according to claim 1, wherein said I/O connectors clear said rear panel bulkhead frame when said bulkhead is being mated with said rear panel bulkhead frame, said I/O connectors are accesssible through said rear panel bulkhead frame when said bulkhead is mated with said rear panel bulkhead frame.

* * * * *